(12) United States Patent
Kim et al.

(10) Patent No.: US 7,012,280 B2
(45) Date of Patent: Mar. 14, 2006

(54) ORGANIC ELECTROLUMINESCENCE DISPLAY DEVICE FABRICATING METHOD OF THE SAME

(75) Inventors: Kyung-Man Kim, Seoul (KR); Jin-Ook Kim, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 215 days.

(21) Appl. No.: 10/750,974

(22) Filed: Jan. 5, 2004

(65) Prior Publication Data

US 2004/0135497 A1    Jul. 15, 2004

Related U.S. Application Data

(62) Division of application No. 10/329,427, filed on Dec. 27, 2002, now Pat. No. 6,689,632.

(30) Foreign Application Priority Data

May 29, 2002    (KR)    ...................... 10-2002-0029946

(51) Int. Cl.
    *H01L 33/00*    (2006.01)

(52) U.S. Cl. ........................... 257/98; 257/79; 257/99; 257/100

(58) Field of Classification Search ................. 257/40, 257/79, 98, 99, 100, 103; 438/26, 29, 34, 438/82
See application file for complete search history.

(56) References Cited

U.S. PATENT DOCUMENTS

| | | | | |
|---|---|---|---|---|
| 6,025,894 A | * | 2/2000 | Shirasaki et al. | ............. 349/69 |
| 6,080,030 A | * | 6/2000 | Isaka et al. | .................... 445/24 |
| 6,456,003 B1 | * | 9/2002 | Mori et al. | .......... 257/E51.051 |
| 6,459,199 B1 | * | 10/2002 | Kido et al. | .................... 438/35 |
| 6,476,988 B1 | * | 11/2002 | Yudasaka | .................... 359/885 |
| 6,555,840 B1 | * | 4/2003 | Hudson et al. | ................ 257/40 |

\* cited by examiner

*Primary Examiner*—Kevin M. Picardat
(74) *Attorney, Agent, or Firm*—McKenna Long & Aldridge LLP

(57)    ABSTRACT

An organic electroluminescence display device includes a substrate including an emission region and a non-emission region, a first electrode on the substrate, a buffer layer on the first electrode, the buffer layer corresponding to the non-emission region, a partition wall on the buffer layer, the partition wall including a polymer, a first carrier transporting layer on the substrate including the partition wall, the first carrier transporting layer having a hydrophilic portion corresponding to the emission region and a hydrophobic portion corresponding to the non-emission region, an emissive layer on the first carrier transporting layer, the emissive layer corresponding to the hydrophilic portion, a second carrier transporting layer on the emissive layer, and a second electrode on the second carrier transporting layer.

10 Claims, 5 Drawing Sheets

ORGANIC ELECTROLUMINESCENCE DISPLAY DEVICE FABRICATING METHOD OF THE SAME

This application is a divisional of prior application Ser. No. 10/329,427, filed Dec. 27, 2002, now U.S. Pat. No. 6,689,632.

This application claims the benefit of the Korean Patent Application No. P2002-029946 filed on May 29, 2002, which is hereby incorporated by reference for all purposes as if fully set forth herein.

BACKGROUND OF THE INVENTION

1. Field of the Invention

The present invention relates to an electroluminescence display device, and more particularly, to an organic electroluminescence display device and a fabricating method of the same.

2. Discussion of the Related Art

Recently, flat panel displays have been proposed as a display device due to their characteristics of being thin, light weight, and low in power consumption. The flat panel displays include a liquid crystal display, a plasma display panel, a field emission display, and an electroluminescence display.

Among these displays, the electroluminescence display may be categorized into an inorganic electroluminescence display device and an organic electroluminescence display device depending upon a source material for exciting carriers. The organic electroluminescence display (OELD) device has drawn a considerable attention due to its high brightness, low driving voltage, and natural color images from the entire visible light range. Additionally, the OELD device has a wide viewing angle and a great contrast ratio because of self-luminescence. Since the OELD device does not require an additional light source such as a backlight, the OELD device has small size and light weight and low power consumption as compared with the liquid crystal display. Furthermore, the OELD device can be driven by a low voltage of direct current (DC), and has a short response time of several microseconds. Since the OELD device is totally solid phase, it is sufficiently strong to withstand external impacts and has a greater operational temperature range. Additionally, the OELD device can be manufactured at a low cost. Particularly, only deposition and encapsulation apparatuses are necessary for manufacturing the organic EL devices, and thus a manufacturing process of the OELD device is very simple in contrast with the liquid crystal display or plasma display panel.

The organic electroluminescence display device may be classified into a passive matrix type and an active matrix type depending upon a driving method.

The passive matrix type, which does not have additional thin film transistors (TFTs), has been conventionally used. In the passive matrix OELD device, scanning lines and signal lines perpendicularly cross each other to be arranged in a matrix shape. Since a scanning voltage is sequentially applied to the scanning lines to operate each pixel, an instantaneous brightness of each pixel during a selection period should reach a value resulting from multiplying the average brightness by the number of the scanning lines to obtain a required average brightness. Accordingly, as the number of the scanning lines increases, applied voltage and current also increase. Therefore, the passive matrix OELD device is not adequate to a display of high resolution and large area because the device is easily deteriorated and the power consumption is high.

Since the passive matrix OELD device has many limitations in resolution, power consumption and lifetime, an active matrix OELD device has been researched and developed as a next generation display device requiring high resolution and large display area. In the active matrix OELD device, a thin film transistor (TFT) is disposed at each sub-pixel as a switching element for turning on/off each sub-pixel. A first electrode connected to the TFT is turned on/off by the sub-pixel and a second electrode facing the first electrode functions as a common electrode. Moreover, a voltage applied to the pixel is stored in a storage capacitor, thereby maintaining the voltage and driving the device until a voltage of next frame is applied, regardless of the number of the scanning lines. As a result, since an equivalent brightness is obtained with a low applied current, an active matrix OELD device of low power consumption, high resolution and large area may be made.

FIG. 1 shows a band diagram of a related art organic electroluminescence display. As shown in FIG. 1, the related art organic electroluminescence display includes an anode electrode 1, a cathode electrode 7, a hole transporting layer 3, an emissive layer 4, and an electron transporting layer 5 between the anode electrode 1 and the cathode electrode 7. The related art organic electroluminescence display device further includes a hole injection layer 2, which is disposed between the anode electrode 1 and the hole transporting layer 3, and an electron injection layer 6, which is disposed between the cathode electrode 7 and the electron transporting layer 5, to efficiently inject holes and electrons.

The holes and the electrons are injected into the emissive layer 4 through the hole injection layer 2 and the hole transporting layer 3 from the anode electrode and through the electron injection layer 7 and the electron transporting layer 5 from the cathode electrode 7, respectively, thereby generating an exciton 8 in the emissive layer 4. Then, light corresponding to energy between the hole and the electron is emitted from the exciton 8.

The anode electrode 1 is formed of a transparent conductive material having a relatively high work function such as indium-tin-oxide and indium-zinc-oxide. Light is observed at the anode electrode 1. On the other hand, the cathode electrode 7 is formed of an opaque conductive material having a relatively low work function, such as aluminum, calcium, and aluminum alloy.

In the OELD device, in order to display full color images, the organic emissive layers of red, green and blue are formed by sub-pixels, respectively, and an insulating material is used as a partition wall. The partition wall can separate adjacent organic emissive layers and adjacent cathode electrodes to be formed thereon by sub-pixels without a patterning process.

In the OELD device having the partition wall, a printing method is widely used by dropping an organic emissive material solution of an ink type at a portion between the adjacent partition walls.

FIGS. 2A to 2D illustrate a fabricating method of a related art organic electroluminescence display device using an inkjet method.

In FIG. 2A, an anode electrode 12 is formed on a substrate 10, which has an emission region "A" and a non-emission region "B" defined thereon. A buffer layer 14 is formed on the anode electrode 12 in the non-emission region "B", and a partition wall 16 is formed on the buffer layer 14. The buffer layer 14 is widely made of silicon oxide (SiO2).

The partition wall 16 includes a polyimide and makes it possible that an organic emissive layer (not shown) and a cathode electrode (not shown) will be formed without a patterning process in the next step, wherein the organic emissive layer is formed by using an inkjet method. Although not shown in the figure, the partition wall 16 may have an inverse taper, that is, an inverse trapezoid having the top side longer than the bottom side depending on exposing extents.

In the inkjet printing method, a solution of an ink type is used, and the solution includes a water-soluble organic emissive material. Therefore, the anode electrode 12 and the buffer layer 14, which are disposed in the emission region "A", should be hydrophilic in order to attach the solution thereto, while the partition wall 16, which is disposed in the non-emission region "B", should be hydrophobic in order to prevent the partition wall 16 from being stained with the solution.

That is, in a high definition OELD fabricated by the inkjet printing method, before forming the organic emissive layer, a step to differ wettability of the elements in the emission region "A" from that in the non-emission region "B" is required.

In FIG. 2B, the substrate 10 including the partition wall 16 is disposed in a vacuum chamber (not shown), and a first plasma treatment using an oxygen ($O_2$) gas is carried out to have the anode electrode 12 and the buffer layer 14 possess the characteristics of hydrophilicity. Next, a second plasma treatment using a carbon tetrafluoride ($CF_4$) gas is carried out to have the partition wall 16 possess the characteristics of hydrophobicity. Therefore, the surface of the partition wall 16 has hydrophobicity and the surfaces of the anode electrode 12 and the buffer layer 14 exposed by the partition wall 16 have hydrophilicity.

In FIG. 2C, an organic electroluminescent layer 18, which may include a hole transporting layer, an organic emissive layer and an electron transporting layer, is formed on the substrates including the partition wall 16 of hydrophobicity by using an inkjet printing method. The organic electroluminescent layer 18 is made of a water-soluble material having an ink type. The organic electroluminescent layer 18 is formed on only the anode electrode 12 and the buffer layer 14 in the emission region "A," and has a hemisphere shape because the anode electrode 12 and the buffer layer 14 are hydrophilic while the partition wall 16 is hydrophobic.

In FIG. 2D, a cathode electrode 20 is formed on the organic electroluminescent layer 18 by a deposition method using a metallic material of being reflective. A metal layer 19 made of the same material as the cathode electrode 20 is also formed on the partition wall 16. The metal layer 19 is disconnected from the cathode electrode 20. Therefore, the cathode electrode 20 is patterned without the patterning process because of the partition wall 16.

By the way, in the related art inkjet printing method, since plasma treatments are carried out two times, defects may be obtained in the unexpected area due to physical or chemical reaction from the plasma treatments. Additionally, a manufacturing process is complicated because of different plasma conditions depending on source materials.

SUMMARY OF THE INVENTION

Accordingly, the present invention is directed to an organic electroluminescence display device and a fabricating method of the same that substantially obviates one or more of problems due to limitations and disadvantages of the related art.

Another advantage of the present invention is to provide an organic electroluminescence display device and a fabricating method of the same that improves an image quality through a simply manufacturing process.

Another advantage of the present invention is to provide an organic electroluminescence display device and a fabricating method of the same that display full color images.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a substrate including an emission region and a non-emission region, a first electrode on the substrate, a buffer layer on the first electrode, the buffer layer corresponding to the non-emission region, a partition wall on the buffer layer, the partition wall including a polymer, a first carrier transporting layer on the substrate including the partition wall, the first carrier transporting layer having a hydrophilic portion corresponding to the emission region and a hydrophobic portion corresponding to the non-emission region, an emissive layer on the first carrier transporting layer, the emissive layer corresponding to the hydrophilic portion, a second carrier transporting layer on the emissive layer, and a second electrode on the second carrier transporting layer.

In another aspect of the present invention, a fabricating method of an organic electroluminescence display device includes forming a first electrode on a substrate including an emission region and a non-emission region, forming a buffer layer on the first electrode, the buffer layer corresponding to the non-emission region, forming a partition wall on the buffer layer, the partition wall including a polymer, forming a first carrier transporting layer on the partition wall, the first carrier transporting layer covering the entire substrate including the partition wall, treating the first carrier transporting layer with an oxygen plasma, thereby the first carrier transporting layer having hydrophilicity, attaching a mold to the first carrier treated with the oxygen plasma, thereby the first carrier transporting layer corresponding to the non-emission region having hydrophobicity, removing the mold from the first carrier transporting layer, forming an emissive layer on the first carrier transporting layer using a coating method, the emissive layer corresponding to the emission region, forming a second carrier transporting layer on the emissive layer, and forming a second electrode on the second carrier transporting layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiment of the present invention, an example of which is illustrated in the accompanying drawings.

In the present invention, an organic electroluminescent layer, especially an emissive layer having a color of red, green and blue by a sub-pixel, is formed by a coating method using a nozzle apparatus or a roller. The organic electroluminescent layer may include a first carrier transporting layer, the emissive layer and a second carrier transporting layer. The emissive layer may be formed on a first carrier transporting layer by the coating method after the first carrier transporting layer is formed on the entire surface of a substrate by the coating method. At this time, the emissive layer may be formed in other sub-pixel regions even though there is a trifling error, and quality of full color images may be lowered.

FIGS. 3A to 3E are schematic cross-sectional views illustrating a fabricating method of an organic electroluminescence display device according to an embodiment of the present invention.

Figure 1:
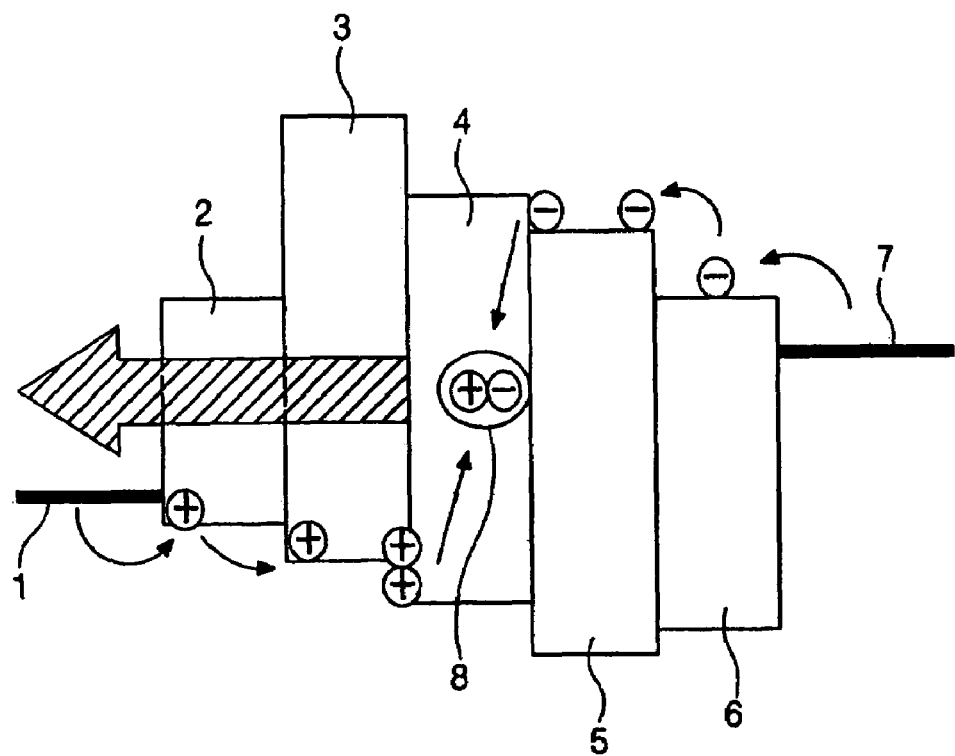
FIG. 1 is a band diagram of a related art organic electroluminescence display.
Figure 2A:
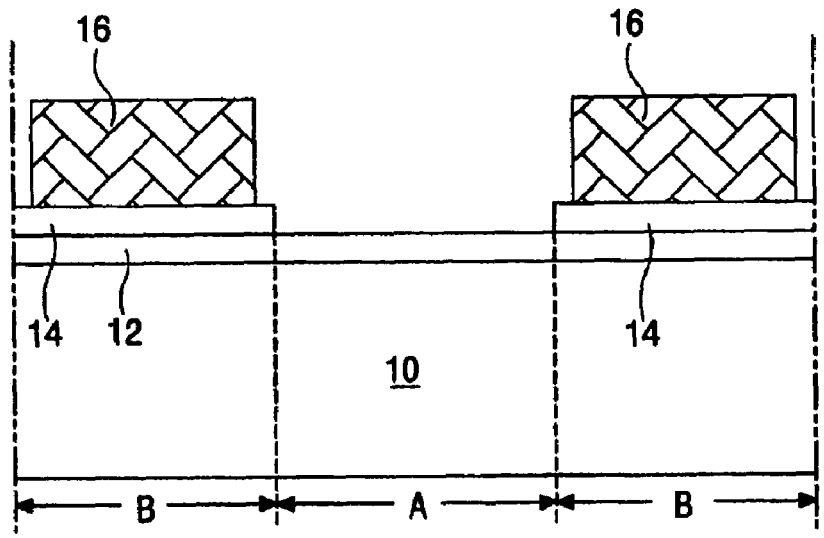
FIGS. 2A to 2D are schematic cross-sectional views illustrating a fabricating method of a related art organic electroluminescence display device.
Figure 2B:
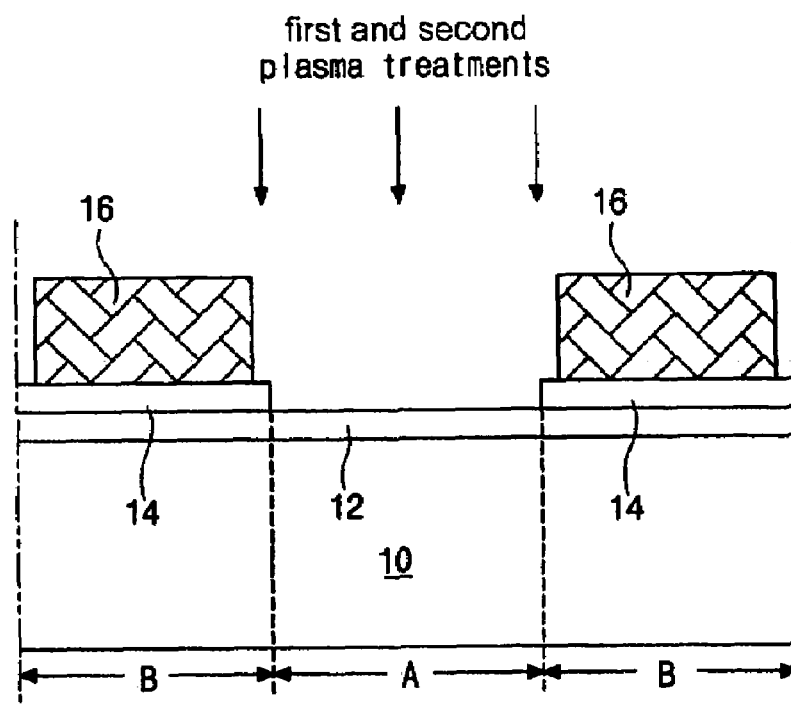
Figure 2C:
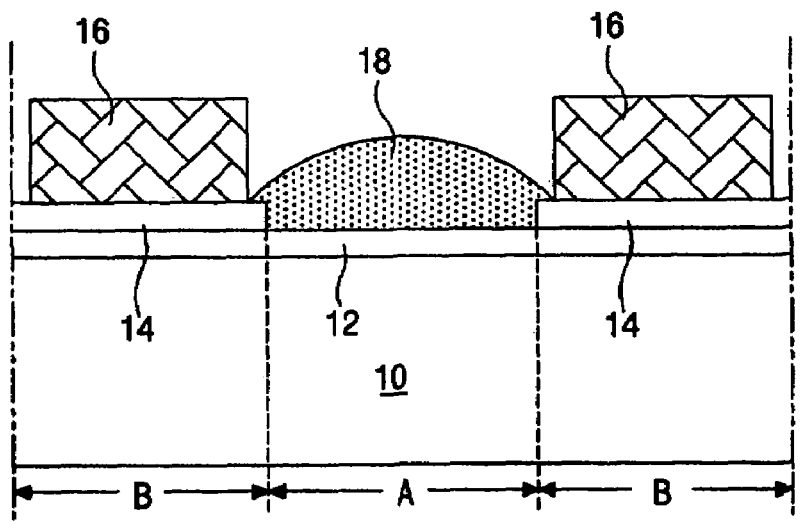
Figure 2D:
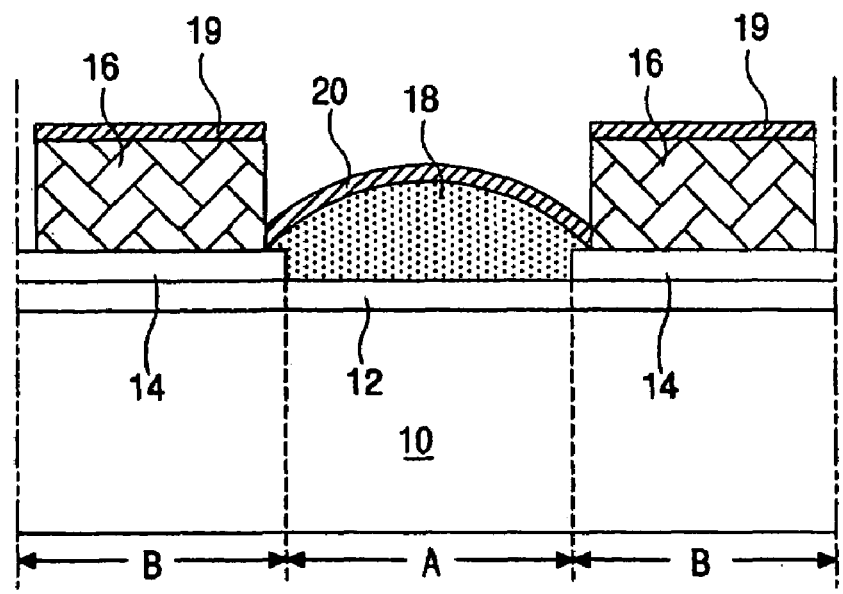
Figure 3A:
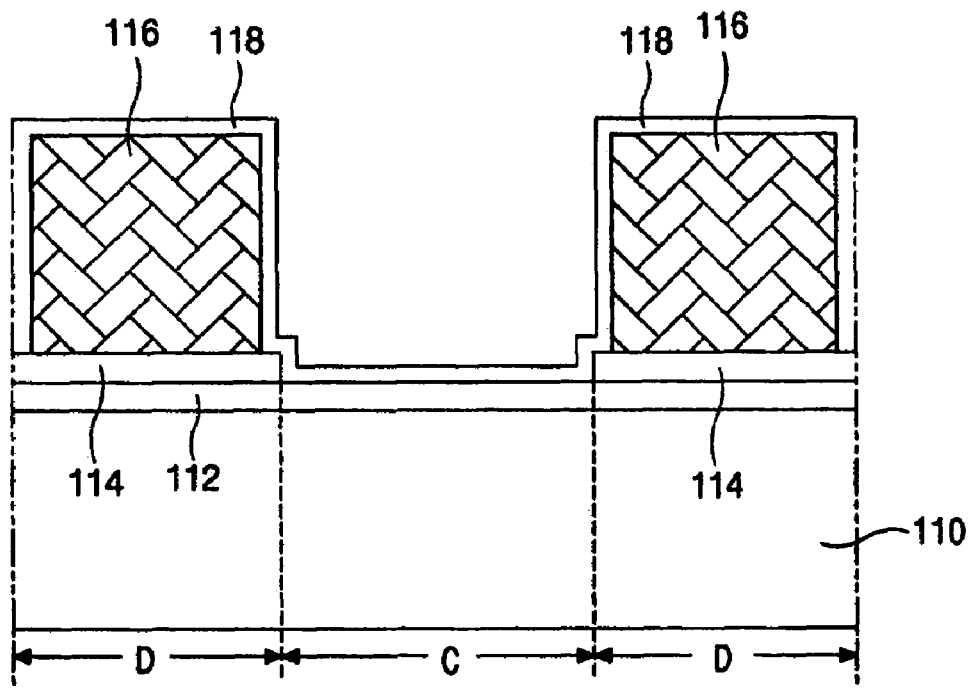
FIGS. 3A to 3E are schematic cross-sectional views showing a fabricating method of an organic electroluminescence display device according to an embodiment of the present invention.

In FIG. 3A, a first electrode 112 is formed on a substrate 110, which has an emission region "C" and a non-emission region "D" defined thereon. A buffer layer 114 is formed on the first electrode 112 in the non-emission region "D," and a partition wall 116 is formed on the buffer layer 114. A first carrier transporting layer 118 is formed on the entire substrate 110 including the partition wall 116.

In a bottom emission type, in which light is emitted through the first electrode 112, for example, the first electrode 112 functions as an anode and should be made of a transparent conductive material. The first electrode 112, preferably, includes one of indium-tin-oxide (ITO), indium-zinc-oxide (IZO) and indium-tin-zinc-oxide (ITZO). At this time, the first carrier transporting layer 118 is a hole transporting layer, and may include poly(3,4-ethylenedioxythiophene)-poly(styrene sulfonic acid) (PEDOT-PSS) that possess the strong characteristics of hydrophilicity. The first carrier transporting layer 118 may further include a hole injection layer.

On the other hand, in a top emission type, the first electrode 112 functions as a cathode, and is made of a metallic material having a relatively low work function. Here, the first carrier transporting layer 118 is an electron transporting layer, and may further include an electron injection layer.

As not shown in the figure, the substrate 110 may include a switching thin film transistor (TFT), a driving TFT and a storage capacitor thereon.

Figure 3B:
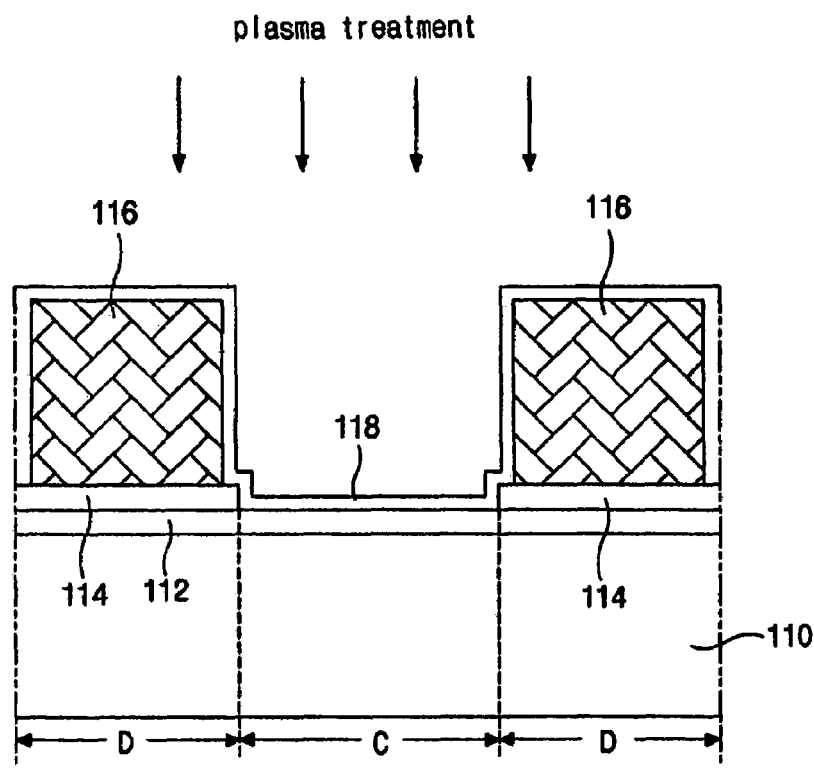

In FIG. 3B, an oxygen ($O_2$) plasma treatment is carried out to have the first transporting layer 118 possess the characteristics of hydrophilicity. The oxygen plasma treatment is accomplished in a vacuum chamber (not shown). The substrate 110 including the first carrier transporting layer 118 is disposed in the vacuum chamber, and the oxygen plasma treatment is carried out for about 30 seconds.

Argon (Ar) (an inert gas) is also used, and a mass flow rate of argon and oxygen is about 8:2. An applied power and a voltage are about 1,000 W and about 50 V, respectively.

Figure 3C:
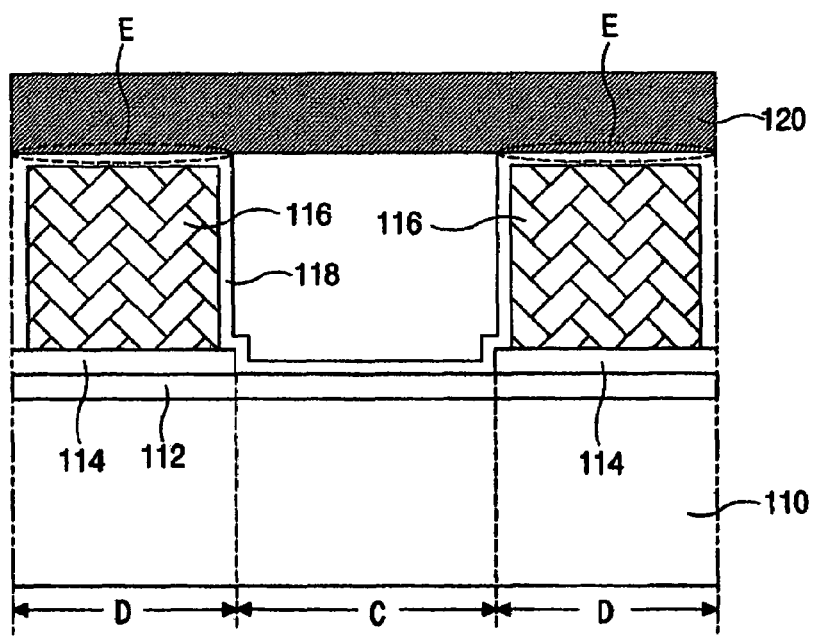

Next, in FIG. 3C, a mold 120 is disposed on the first carrier transporting layer 118, and is attached to the first carrier transporting layer 118 in the non-emission region "D", so that the first carrier transporting layer 118 attached the mold 120 possesses the characteristics of hydrophobicity. The mold 120 has flat surfaces and covers the whole substrate 110 including the first carrier transporting layer 118 without any patterns. The mold 120 includes a silicon rubber having hydrophilicity. The mold 120 may include one of polydimethylsiloxane (PDMS), polyurethane rubber, and elastomer. The mold 120, for example, is formed through a process of mixing polydimethylsiloxane (PDMS) and a hardening agent of about 10 wt. % and treating with heat at a temperature of about 90 degrees centigrade. This step lasts for about 1 minute to about 10 minutes under a temperature within a range of about a room temperature to about 100 degrees centigrade or for about 5 minutes under a temperature about 60 degrees centigrade. Then, the mold 120 is removed from the first carrier transporting layer 118. Therefore, the surface "E" of the first carrier transporting layer 118 in the non-emission region "D" has hydrophilicity.

Figure 3D:
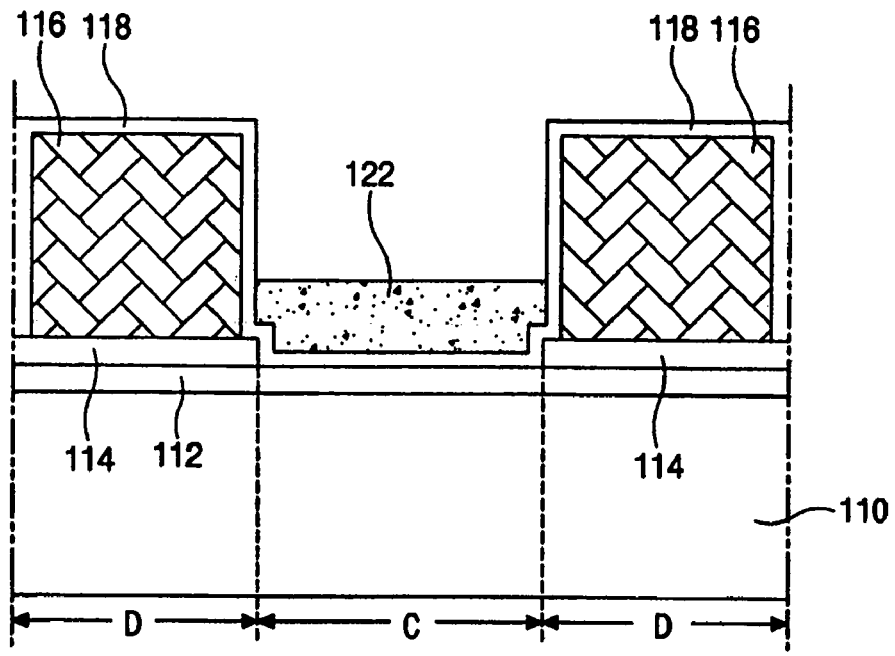

In FIG. 3D, an emissive layer 122 is formed on the first carrier transporting layer 118 in the emission region "C" by a coating method. For example, in a coating method using a nozzle apparatus, an emissive material is coated on the substrate 110 including the first carrier transporting layer 118 through the nozzle. The emissive material is coated only in the emission region "C" because the first carrier transporting layer 118 in the non-emission region "D" possesses the characteristics of hydrophobicity. Therefore, mixing of emissive materials of adjacent different colors over the partition wall 116 is prevented. On the other hand, in a coating method using a roller, this is the same. The emissive material includes a water-soluble polymer of a liquid phase.

Figure 3E:
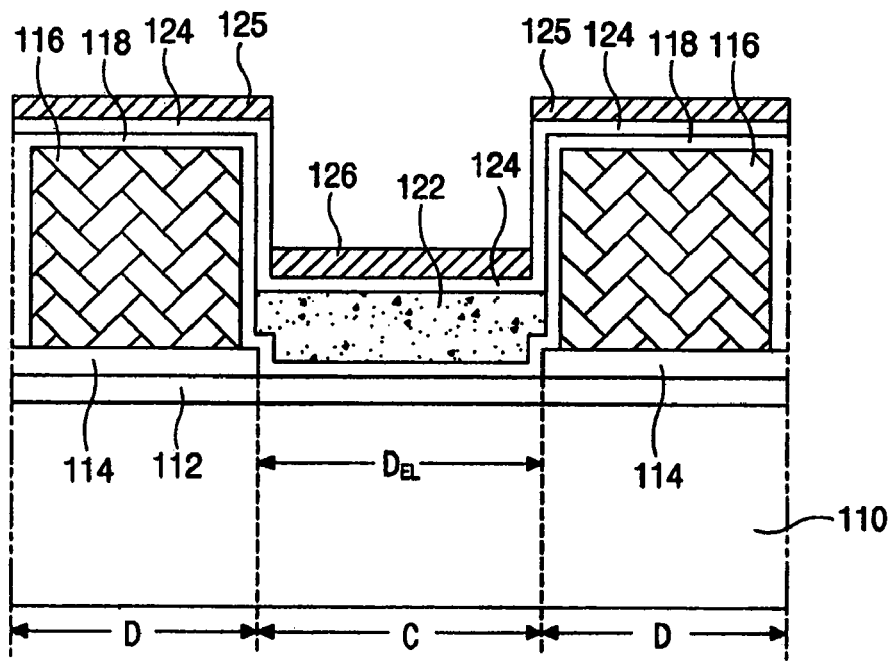

In FIG. 3E, a second carrier transporting layer 124 and a second electrode 126 are subsequently formed on the emissive layer 122. While the second carrier transporting layer 124 covers the entire substrate 110, the second electrode 126 is formed in only the emission region "C". A metal layer 125 made of the same material as the second electrode 126 is formed on the second carrier transporting layer 124 in the non-emission region "D", and is disconnected from the second electrode 126. If the second electrode 126 functions as a cathode, the second carrier transporting layer 124 becomes an electron transporting layer. The second carrier transporting layer 124 may further include an electron injecting layer between the second electrode 126 and the electron transporting layer. An organic electroluminescent diode "$D_{EL}$" is composed of the first electrode 112, the first carrier transporting layer 118, the emissive layer 122, the second carrier transporting layer 124, and the second electrode 126.

The method of forming the organic electroluminescent layer according to the present invention may be used in a fabricating process of a full color display device having high resolution, which has minute and fine patterns.

In the present invention, a manufacturing process is simplified. Additionally, image quality is improved, and full color images of high resolution are provided.

It will be apparent to those skilled in the art that various modifications and variations can be made in the organic electroluminescence display device and the method of fabricating the same of the present invention without departing from the spirit or scope of the inventions. Thus, it is intended that the present invention covers the modifications and variations of this invention provided they come within the scope of the appended claims and their equivalents.

What is claimed is:

1. An organic electroluminescence display device, comprising:
   a substrate including an emission region and a non-emission region;
   a first electrode on the substrate;
   a buffer layer on the first electrode, the buffer layer corresponding to the non-emission region;
   a partition wall on the buffer layer, the partition wall including a polymer;
   a first carrier transporting layer on the substrate including the partition wall, the first carrier transporting layer having a hydrophilic portion corresponding to the emission region and a hydrophobic portion corresponding to the non-emission region;
   an emissive layer on the first carrier transporting layer, the emissive layer corresponding to the hydrophilic portion;
   a second carrier transporting layer on the emissive layer; and
   a second electrode on the second carrier transporting layer.

2. The device according to claim 1, wherein the hydrophilic portion of the first carrier transporting layer is formed by an oxygen plasma treatment.

3. The device according to claim 2, wherein the hydrophobic portion of the first carrier transporting layer is formed by using a mold made of a silicon rubber.

4. The device according to claim 1, wherein the first electrode and the second electrode function as an anode and a cathode, respectively.

5. The device according to claim 1, wherein the emissive layer is formed by a coating method using one of a nozzle apparatus and a roller.

6. The device according to claim 5, wherein the emissive layer is formed by using a solution including a water-soluble polymer emissive material.

7. The device according to claim 1, wherein the first carrier transporting layer includes a hole injection layer and a hole transporting layer.

8. The device according to claim 7, wherein the hole transporting layer includes poly(3,4-ethylenedioxythiophene)-poly(styrene sulfonic acid).

9. The device according to claim 1, wherein the second carrier transporting layer includes an electron transporting layer and an electron injection layer.

10. The device according to claim 1, wherein the second carrier transporting layer covers the first carrier transporting layer.

* * * * *